United States Patent
Huss et al.

(10) Patent No.: US 11,165,554 B1
(45) Date of Patent: Nov. 2, 2021

(54) TRANSMITTER TEST USING PHASE-LOCK LOOP

(71) Applicant: Cadence Design Systems, Inc., San Jose, CA (US)

(72) Inventors: Scott David Huss, Cary, NC (US); Jeffrey Andrew Shafer, Wake Forest, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/081,790

(22) Filed: Oct. 27, 2020

(51) Int. Cl.
*G06F 1/04* (2006.01)
*H04L 7/033* (2006.01)
*H03L 7/081* (2006.01)
*H03M 9/00* (2006.01)

(52) U.S. Cl.
CPC ............. *H04L 7/0331* (2013.01); *G06F 1/04* (2013.01); *H03L 7/0814* (2013.01); *H03M 9/00* (2013.01)

(58) Field of Classification Search
CPC . G06F 1/12; G06F 1/04; H04L 7/0331; G01R 31/28–31937
See application file for complete search history.

(56) References Cited

U.S. PATENT DOCUMENTS

| 4,048,481 A | * | 9/1977 | Bailey, Jr. | G06F 11/2215 714/41 |
| 8,692,597 B1 | * | 4/2014 | Hiebert | H03L 7/081 327/157 |
| 9,921,899 B2 | * | 3/2018 | Wong | H04L 1/00 |
| 10,254,331 B2 | * | 4/2019 | Ware | G01R 31/2607 |
| 10,419,203 B1 | * | 9/2019 | Novellini | H04L 7/0331 |
| 2004/0052322 A1 | * | 3/2004 | Robertson | H04L 25/14 375/371 |

* cited by examiner

*Primary Examiner* — Qutbuddin Ghulamali
(74) *Attorney, Agent, or Firm* — Schwegman Lundberg & Woessner, P.A.

(57) ABSTRACT

Various embodiments provide for testing a transmitter using a phase-lock loop, which can be used with a circuit for data communications, such as serializer/deserializer (SerDes) communications. In particular, some embodiments provide for data transmission test of a transmitter by: generating and outputting a pre-determined data pattern through a serializer of the transmitter; sampling a serialized data output of the serializer using a sample clock signal generated by an M/N phase-lock loop (PLL); and using a pattern checker to error check the sampled data to determine whether the data transmission test passes.

20 Claims, 8 Drawing Sheets

| | 0 | 1 | 2 | 3 | 4 | 5 | 6 |
|---|---|---|---|---|---|---|---|
| 0 | 1 | 93 | 185 | 60 | 152 | 27 | 119 |
| 1 | 211 | 86 | 178 | 53 | 145 | 20 | 112 |
| 2 | 204 | 79 | 171 | 46 | 138 | 13 | 105 |
| 3 | 197 | 72 | 164 | 39 | 131 | 6 | 98 |
| 4 | 190 | 65 | 157 | 32 | 124 | 216 | 91 |
| 5 | 183 | 58 | 150 | 25 | 117 | 209 | 84 |
| 6 | 176 | 51 | 143 | 18 | 110 | 202 | 77 |
| 7 | 169 | 44 | 136 | 11 | 103 | 195 | 70 |
| 8 | 162 | 37 | 129 | 4 | 96 | 188 | 63 |
| 9 | 155 | 30 | 122 | 214 | 89 | 181 | 56 |
| 10 | 148 | 23 | 115 | 207 | 82 | 174 | 49 |
| 11 | 141 | 16 | 108 | 200 | 75 | 167 | 42 |
| 12 | 134 | 9 | 101 | 193 | 68 | 160 | 35 |
| 13 | 127 | 2 | 94 | 186 | 61 | 153 | 28 |
| 14 | 120 | 212 | 87 | 179 | 54 | 146 | 21 |
| 15 | 113 | 205 | 80 | 172 | 47 | 139 | 14 |
| 16 | 106 | 198 | 73 | 165 | 40 | 132 | 7 |
| 17 | 99 | 191 | 66 | 158 | 33 | 125 | 217 |
| 18 | 92 | 184 | 59 | 151 | 26 | 118 | 210 |
| 19 | 85 | 177 | 52 | 144 | 19 | 111 | 203 |
| 20 | 78 | 170 | 45 | 137 | 12 | 104 | 196 |
| 21 | 71 | 163 | 38 | 130 | 5 | 97 | 189 |
| 22 | 64 | 156 | 31 | 123 | 215 | 90 | 182 |
| 23 | 57 | 149 | 24 | 116 | 208 | 83 | 175 |
| 24 | 50 | 142 | 17 | 109 | 201 | 76 | 168 |
| 25 | 43 | 135 | 10 | 102 | 194 | 69 | 161 |
| 26 | 36 | 128 | 3 | 95 | 187 | 62 | 154 |
| 27 | 29 | 121 | 213 | 88 | 180 | 55 | 147 |
| 28 | 22 | 114 | 206 | 81 | 173 | 48 | 140 |
| 29 | 15 | 107 | 199 | 74 | 166 | 41 | 133 |
| 30 | 8 | 100 | 192 | 67 | 159 | 34 | 126 |

410 (row index) ← 412 (column index)

TRANSMITTER TEST USING PHASE-LOCK LOOP

TECHNICAL FIELD

Embodiments described herein relate to data communications and, more particularly, to testing a transmitter using a phase-lock loop, which can be used with a communication circuit, such as a data serializer.

BACKGROUND

Digital communication transmitter circuits, such as ones that include a data serializer (hereafter, serializer), are usually tested by their manufacturer using a test that is built into the transmitter circuits. Such a test is often referred to as a built-in-self test or BIST of a circuit. In the context of data communication between two integrated circuits (e.g., die-to-die data communication), communication is facilitated by a transmitter and a receiver that are implemented on separate integrated circuits (e.g., separate integrated circuit (IC) die). As such, prior to the separate integrated circuits being coupled together, a built-in test of the transmitter is typically performed using a full receiver to test (e.g., screen) a transmit macro outputted by the transmitter.

BRIEF DESCRIPTION OF THE DRAWINGS

Various ones of the appended drawings merely illustrate example embodiments of the present disclosure and should not be considered as limiting its scope.

DETAILED DESCRIPTION

Various embodiments provide for testing a transmitter using a phase-lock loop, which can be used with a circuit for data communications, such as serializer/deserializer (SerDes) communications. In particular, various embodiments facilitate testing (e.g., built-in testing) of a transmitter without use of a receiver. For instance, a transmitter tested by various embodiments is implemented on a first integrated circuit (e.g., first IC die), where the transmitter facilitates communication (e.g., die-to-die communication) between the first integrated circuit and a second integrated circuit (e.g., second IC die) that implements a receiver. Some embodiments enable testing of a transmitter (e.g., on a first integrated circuit) prior to the transmitter being coupled to a receiver (e.g., on a second integrated circuit).

Some embodiments provide for data transmission test of a transmitter by: generating and outputting a pre-determined data pattern (e.g., a pseudorandom binary sequence (PRBS), such as PRBS5 or PRBS7) through a serializer of the transmitter (e.g., output at full data transmission speed); sampling (e.g., sub-sampling) a serialized data output of the serializer using a sample clock signal generated by an M/N phase-lock loop (PLL) (also known as a fractional-N PLL): and using a pattern checker to error check the sampled data to determine whether the data transmission test passes. The pre-defined data pattern can comprise, for example, PRBS5, PRBS7, PRBS15, PRBS23, PRBS31, or a user-defined data pattern (e.g., 1, 2, 3, or 4 32-bit words). For some embodiments, the sample clock signal comprises a clock signal that is asynchronous with respect to the reference clock signal (e.g., a pseudo-asynchronous clock signal, since generated based on the reference clock signal).

By using an asynchronous clock signal to sample data outputted by the serializer, various embodiments can sample the serialized data at a sufficient number of samples per a unit interval (UI) to achieve proper sample resolution for checking against the pre-determined data pattern. Sampling using the M/N PLL can permit various embodiments to avoid using clock data recovery (CDR) to facilitate a data transmission test. With an asynchronous clock signal generated by an M/N PLL, some embodiments can sample the pre-determined data pattern (e.g., PRBS) at a fixed rate during a data transmission test. For some embodiments, based on the sample clock signal generated by the MIN PLL, the pre-determined data pattern is sampled out of order (e.g., not in sequential order in which it is transmitted) during the data transmission test. For some such embodiments, the out-of-order sequence is known/expected by a pattern checker, so that when samples are collected by the pattern checker (e.g., into memory, such as a set of registers), the samples of the pre-determined data pattern are written back in their transmitted order based on the known (out-of-order) sequence (thereby reconstructing the pre-determined data pattern in the matrix in its transmitted order). The known sequence in which the pre-determined data pattern is sampled (and then reordered during sample collection) can be based on, for example, a sample rate of the pre-determined data pattern, a length of the pre-determined data pattern, or both.

For some embodiments, after sufficient number of samples are collected (e.g., the entire memory is filled), the results is a collection of several (e.g., evenly spaced) phase samples of the pre-determined data pattern, which can permit an embodiment to effectively generate a horizontal eye diagram (e.g., eye plot) of the pre-determined data pattern. Various embodiments compare the sampled data (e.g., after sample reordering) to the pre-determined data pattern to determine whether a data transmission test passes or fails. In this way, some embodiments can determine if an eye width is acceptable to pass or fail the data transmission test. For various embodiments, a separate iteration of the data transmission is performed for each different clock signal (e.g., each of the four phases of clock signals) that is driving a serializer of a transmitter, which can avoid missing data paths in the transmitter.

By use of various embodiments, a transmitter can perform a transmission test without use of a receiver (e.g., a loop-back receiver disposed on the same IC die as the transmitter, or a receiver disposed on a separate IC die), such as a receiver that uses a deserializer where the transmitter uses a serializer. This can reduce power or area that would otherwise be used if a loop-back receiver were included on the IC die of a transmitter to facilitate data transmission testing. Additionally, use of various embodiments can enable a transmitter to perform a data transmission test at-speed (e.g., at full data transmission speed).

Reference will now be made in detail to embodiments of the present disclosure, examples of which are illustrated in the appended drawings. The present disclosure may, however, be embodied in many different forms and should not be construed as being limited to the embodiments set forth herein.

Figure 1:
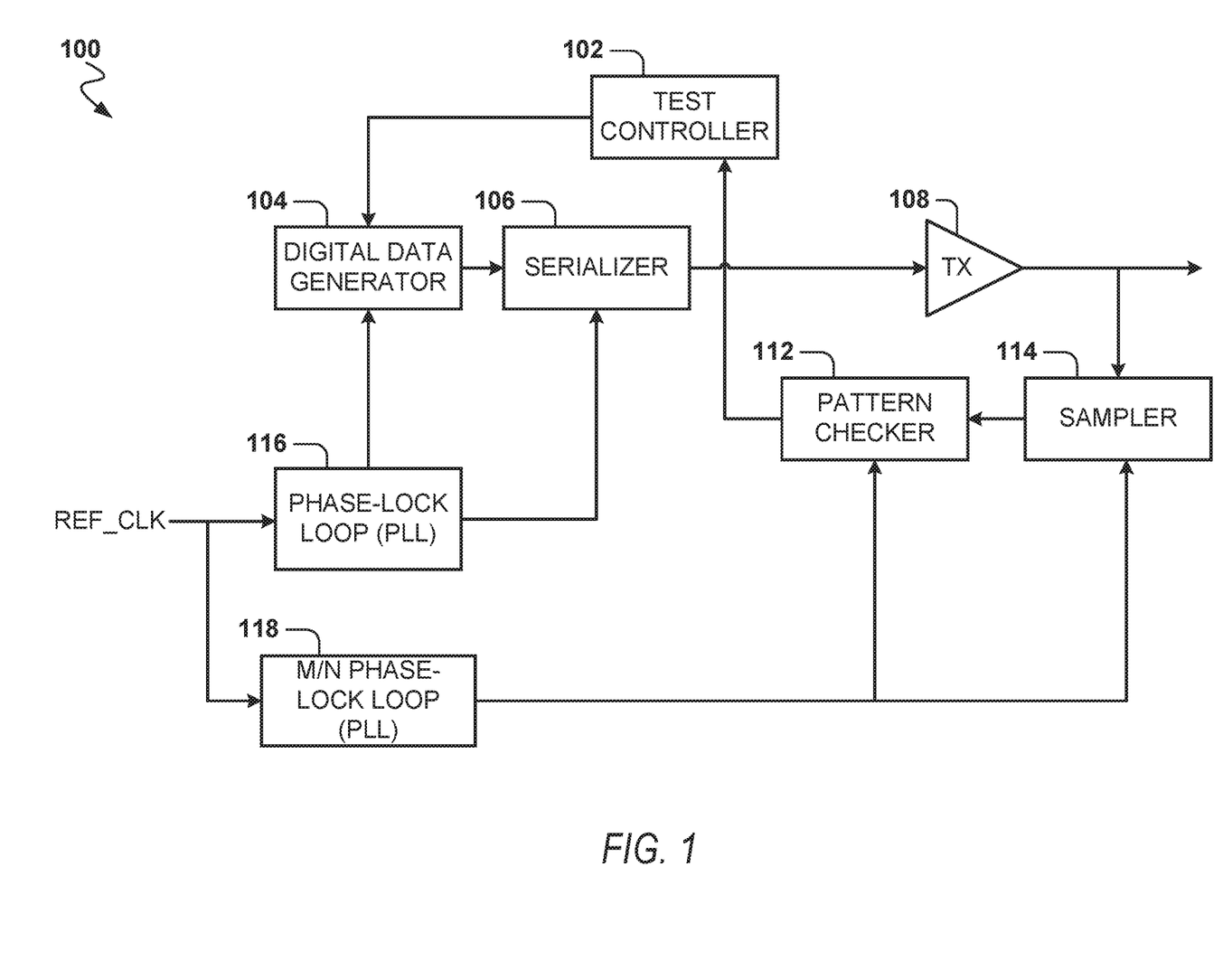
FIG. 1 is a schematic illustrating an example circuit that implements testing a transmitter using a phase-lock loop, in accordance with various embodiments.

FIG. 1 is a schematic illustrating an example circuit 100 that implements testing a transmitter using a phase-lock loop, in accordance with various embodiments. As shown, the circuit 100 comprises a test controller 102, a digital data generator 104, a serializer 106, a driver 108, a data sampler 114 (hereafter, the sampler 114), a pattern checker 112, a phase-lock loop (PLL) 116, and an M/N phase-lock loop (PLL) 118. As also shown, the PLL 116 and the M/N PLL 118 receive a reference clock signal (REF_CLK), the digital data generator 104 is coupled to a first output of the PLL 116, the serializer 106 is coupled to a second output of the PLL 116, each of the pattern checker 112, and the sampler 114 is coupled to an output of the MN PLL 118, the test controller 102 is coupled to an output of the pattern checker 112, and the pattern checker 112 is coupled to an output of the sampler 114.

For some embodiments, the test controller 102 controls operation of the digital data generator 104 to facilitate generation of a pre-defined data pattern during a data transmission test as described herein. Additionally, for some embodiments, the test controller 102 receives an error check result provided by the pattern checker 112 to determine whether a test result of a data transmission test is a pass or a fail as described herein.

The digital data generator 104 of some embodiments generates digital data and outputs the digital data as parallel digital data. For example, the digital data generator 104 can comprise a parallel data output interface for outputting the parallel digital data. The digital data generator 104 can receive and operate based on a data generator clock signal. For some embodiments, the digital data generator 104 generates and outputs (to the serializer 106) a pre-defined data pattern that facilitates a data transmission test as described herein. For example, the pre-defined data pattern can comprise PRBS7, PRBS15, PRBS23, PRBS31, or a user-defined data pattern (e.g., 1, 2, 3, or 4 32-bit words).

During operation, the PLL 116 can receive a reference clock signal, generate a set of clock signals (e.g., four quarter-rate clock signals) based on the reference clock signal, and generate a data generator clock signal (e.g., FUI/32) for the digital data generator 104. The set of clock signals generated by the PLL 116 is provided to the serializer 106 to facilitate its operation.

Figure 3:
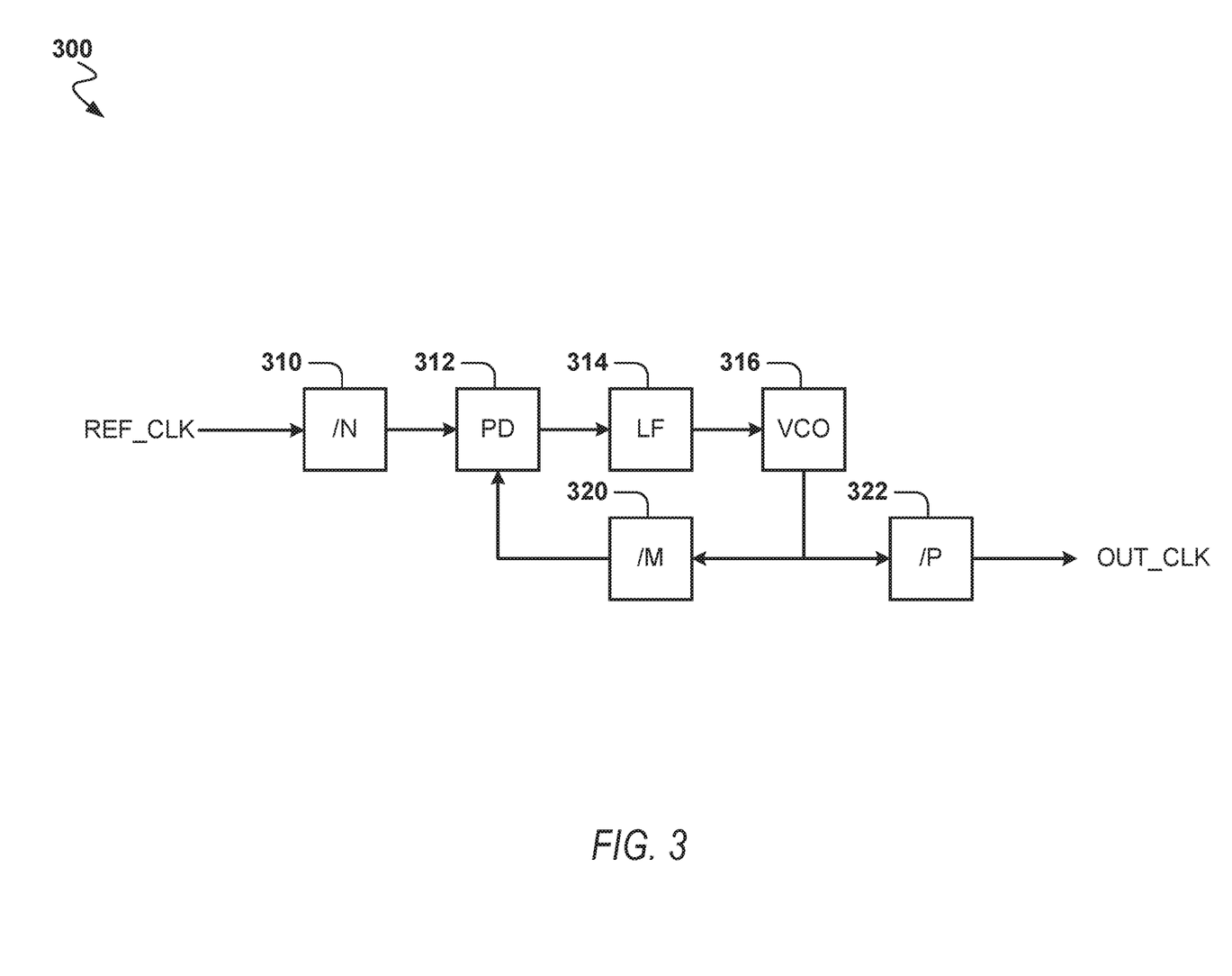
FIG. 3 is a block diagram illustrating an example M/N phase-lock loop that can be used by various embodiments.

The M/N PLL 118 can receive the reference clock signal, and generate a sample clock signal based on the reference clock signal, which can be used by the pattern checker 112 and the sampler 114 in accordance with various embodiments. The M/N PLL 118 comprises a PLL that multiples by M and divides by N. For some embodiments, M and N are co-prime values (separate prime numbers). Additionally, for some embodiments, the M/N PLL 118 comprises a divider that further divides a clock signal by P (e.g., to apply a post divide of the clock signal prior to output, thereby rendering the M/N PLL to be a M/N/P PLL), as illustrated by FIG. 3. For instance, M=7, N=60, and P=4 for the M/N PLL 118, which can generate a sample clock signal having a frequency of 291.66 MHz based on a reference clock signal having a frequency of 10 GHz. The M/N PLL 118 can comprise a voltage-controlled crystal oscillator (VCO), such as a VCO that generates a clock signal having 1 GHz. Where the pre-determined data pattern comprises PRBS5, the M/N PLL 118 can generate a sample clock signal that enables the signal output of the driver 108 to be sampled (e.g., oversampled) seven samples every unit interval (UI).

For some embodiments, the serializer 106 receives parallel digital data (e.g., having a data width of 32-bit) from the digital data generator 104 and the set of clock signals from the PLL 116, and generates serialized digital data based on the parallel digital data and the set of clock signals. For example, the serializer 106 can convert the parallel digital data (e.g., pre-determined data pattern generated by the digital data generator 104) to the serialized digital data using the set of clock signals. For some embodiments, the serializer 106 is implemented by a plurality of serializers coupled in series. For instance, the serializer 106 can comprise an 8-to-1 serializer and a 4-to-1 serializer coupled to output of the 8-to-1 serializer, where: the 8-to-1 serializer receives the parallel digital data (e.g., having a data width of 32-bits) from the digital data generator 104 and generates second parallel digital data (e.g., having a width of 4-bits); and the 4-to-1 serializer receives the second parallel digital data and generates serialized digital data (e.g., having a data width of 1-bit). Additionally, for some embodiments, the serializer 106 comprises a parallel input interface for receiving the parallel digital data, and a serial data output interface for outputting the serialized digital data.

The driver 108 of some embodiments receives serialized digital data from the serializer 106, and generates an amplified output signal based on the serialized digital data. For example, the driver 108 can comprise an analog driver. For various embodiments, the amplified output signal is intended to be received by a deserializer (not shown) of a SerDes communication system. Accordingly, the driver 108 can serve as a driver for a data transmitter.

For some embodiments, the data sampler 114 receives the amplified output signal from the driver 108, receives a sample clock signal from the M/N PLL 118, samples the amplified output signal at multiple (e.g., random) points based on the sample clock signal, and generates (and outputs) sample data based on the sampling. For some embodiments, the data sampler 114 comprises a sampler latch. According to various embodiments, the data sampler 114 facilitates sampling the pre-determined data pattern outputted by the serializer 106 and the driver 108, and outputting a plurality of sampled bits to the pattern checker 112.

For some embodiments, the pattern checker 112 receives and operates based on the sample clock signal from the M/N PLL 118. The pattern checker 112 can comprise a series of flip-flops, and the pattern checker 112 can operate by pre-loading the pre-determined data pattern into the series of flip-flops.

For some embodiments, the pattern checker 112 collects the plurality of sampled bits from the data sampler 114 as the digital data generator 104 generates a pre-determined data pattern. As described herein, after a sufficient number of samples are collected (e.g., the entire memory is filled), the results are a collection of several (e.g., evenly spaced) phase samples of the pre-determined data pattern, which can permit an embodiment to effectively generate a horizontal eye diagram (e.g., eye plot) of the pre-determined data pattern. The pattern checker 112 can collect the plurality of sampled bits from the data sampler 114 (as the digital data generator generates pre-determined data pattern) by storing the plurality of sampled bits in a (first) matrix as it is collected from the data sampler 114. For some embodiments, the collected plurality of sampled bits (e.g., the first matrix) is stored on memory (e.g., set of registers), where the memory can be part of or separate from the pattern checker 112. Various embodiments compare the sampled data (e.g., after sample reordering) to the pre-determined data pattern to determine whether a data transmission test passes or fails. For some embodiments, based on the sample clock signal generated by the M/N PLL 118, the pre-determined data pattern is sampled out of order (e.g., not in sequential order in which it is outputted by the driver 108) during the data transmission test described herein. For some such embodiments, the out-of-order sequence is a known/expected by the pattern checker 112, so that when samples are collected by the pattern checker 112 (e.g., into a matrix stored on memory, such as a set of registers), the samples of the pre-determined data pattern are written back in their transmitted order based on the known (out-of-order) sequence (e.g., thereby reconstructing the pre-determined data pattern in the matrix in its transmitted order).

For some embodiments, the operations of a data transmission test described herein are performed (e.g., repeated) for each of the different clock signals provided by the PLL 116 to the serializer 106, which can ensure data path coverage in the transmitter implemented by circuit 100. For such embodiments, the pattern checker 112 can generate an error check result generated for each of the different clock signals, and provide each of those error check results to the test controller 102. In turn, the test controller 102 can collect the error check results and determine if the overall data transmission test for the transmitter (implemented by circuit 100) is a pass or a failure based on the error results (e.g., sufficient number of the error check results having a pass result).

For some embodiments, the pattern checker 112 error checks the plurality of sampled bits by comparing each individual row of a first matrix (storing the plurality of sampled bits) to a corresponding row of a second matrix, where the second matrix comprises the pre-determined data pattern, and where the second matrix has the same dimensions as the first matrix. For instance, where the first matrix has dimensions of N×M (e.g., 4 bits×8 bits for 32-bit pre-defined data pattern), the second matrix would have the same dimensions. The comparison operation can determine whether the individual row of the first matrix matches the corresponding row of the second matrix based on the comparison, and can generate a comparison pass value (e.g., 1) in response to a match between the individual row and corresponding row. In response to the individual row of the first matrix not matching the corresponding row of the second matrix, the comparison operation can generate a comparison fail value (e.g., 0), which can indicate that there is a mismatch between the first and second matrices and an error exists.

For some embodiments, the pattern checker 112 generates the error check result of the first matrix based on the checking the plurality of sampled bits for errors by: determining a number of individual rows of the first matrix that have the comparison pass value; and generating the error check result of the first matrix based on the determining the number of individual rows of the first matrix that have the comparison pass value. For instance, the pattern checker 112 can determine whether the number of individual rows of the first matrix that have the comparison pass value surpasses a comparison pass threshold value (e.g., all rows of the first matrix), and in response to determining that the number surpasses the comparison pass threshold value, the pattern checker 112 can generate the error check result of the first matrix to comprise a check pass value (e.g., 1). In response to determining that the number does not surpass the comparison pass threshold value, the pattern checker 112 can generate the error check result for the first matrix to comprise a check fail value (e.g., 0).

According to various embodiments, the test controller 102 performs a data transmission test by generating a test result for the data transmission test based on one or more error check results the test controller 102 receives from the pattern checker 112 (e.g., for each of the different clock signals being used by the serializer 106). As described herein, the plurality of error check results can be generated based on a plurality of sampled bits collected by the pattern checker 112, from the data sampler 114, as the digital data generator 104 generates a pre-determined data pattern and the pre-determined data pattern passes through the serializer 106 and the driver 108. In particular, the test controller 102 can cause the digital data generator 104 to generate a pre-determined data pattern. Where operations of the data transmission test are being performed for each of the different clock signals being used by the serializer 106, the test controller 102 can cause the digital data generator 104 to generate a pre-determined data pattern while the serializer 106 is using one of those different clock signals, and can add the error check result (provided by the pattern checker 112) to a plurality of error check results. After these operations are performed for all of the different clock signals, the test controller 102 can generate the test result for the data transmission test based on the plurality of error check results.

For some embodiments, the test controller 102 generates the test result for the data transmission test based on the plurality of error check results by determining a number of error check results in the plurality of error check results that have a check pass value, and generates the test result for the data transmission test based on the determining the number of error check results in the plurality of error check results that have a check pass value. For example, the test controller 102 can determine whether the number of error check results in the plurality of error check results that have the check pass value surpasses a test pass threshold value (e.g., at least a certain percentage of the error check results in the plurality of error check results have a check pass value). In response to determining that the number of error check results in the plurality of error check results that have the check pass value surpasses the test pass threshold value, the test controller 102 can generate the test result to comprise a test pass value; otherwise the test controller 102 can generate the test result to comprise a test fail value. For some embodiments, the test pass threshold value is such that less than all of the error check results have the check pass value.

Figure 2:
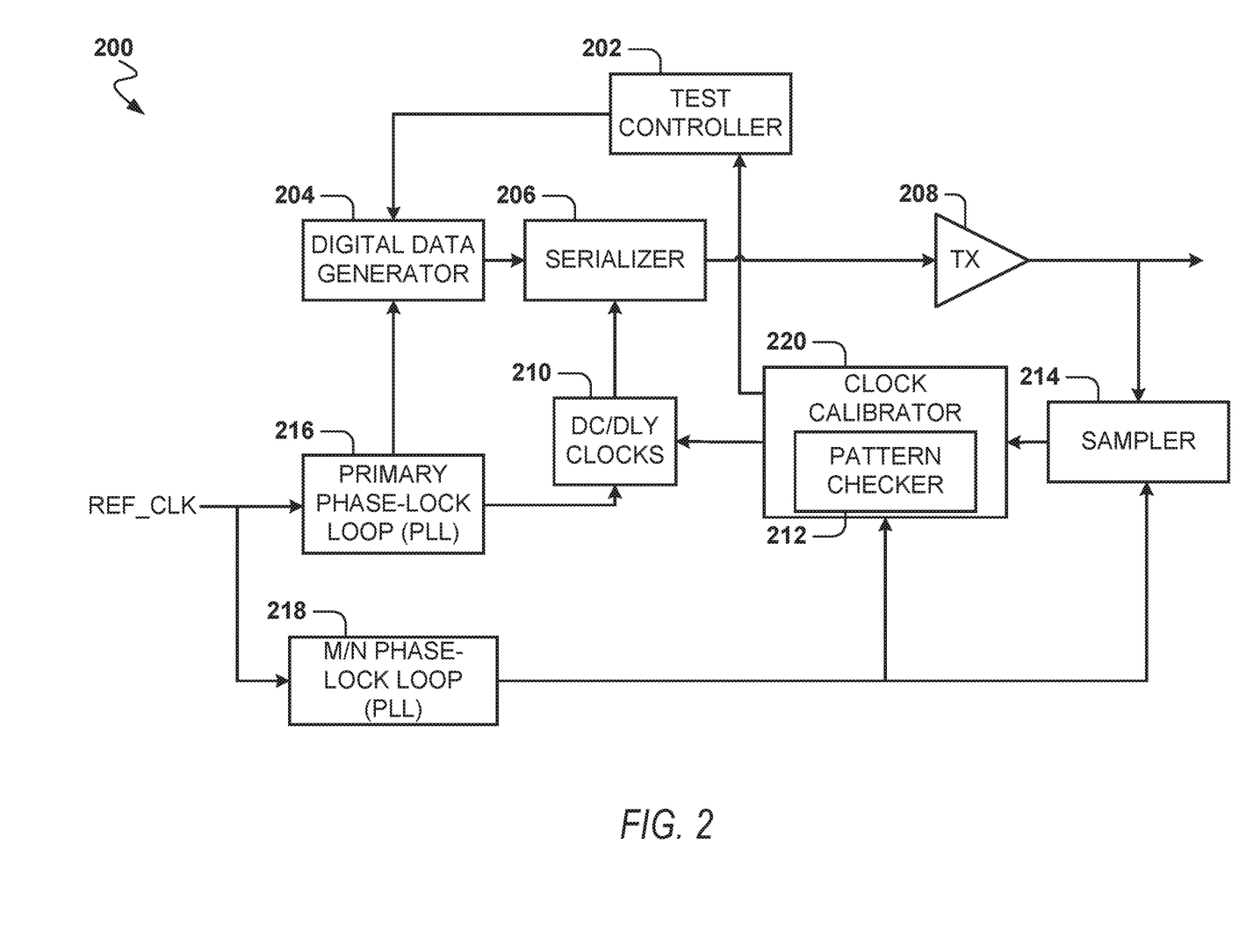
FIG. 2 is a schematic illustrating an example circuit that implements testing a transmitter using a phase-lock loop and that implements clock calibration for a serializer, in accordance with various embodiments.

FIG. 2 is a schematic illustrating an example circuit 200 that implements testing a transmitter using a phase-lock loop and that implements clock calibration for a serializer 206, in accordance with various embodiments. In particular, the circuit 200 illustrates an example of how an M/N PLL 218 can be used to generate an asynchronous or pseudo-asynchronous clock signal, which can facilitate clock calibration for the serializer 206, and to facilitate testing a transmitter as described herein. As shown, the circuit 200 comprises a test controller 202, a digital data generator 204, the serializer 206, a driver 208, a data sampler 214 (hereafter, the sampler 214), a clock calibrator 220 (hereafter, the calibrator 220), a phase-lock loop (PLL) 216, and a M/N phase-lock loop (PLL) 218. According to some embodiments, the digital data generator 204 is similar to the digital data generator 104, the serializer 206 is similar to the serializer 106, the driver 208 is similar to the driver 108, the sampler 214 is similar to the sampler 114, the PLL 216 is similar to the PLL 116, and the M/N PLL 218 is similar to the M/N PLL 118 described with respect to FIG. 1. As also shown, each of the calibrator 220 and the sampler 214 is coupled to an output of the M/N PLL 216, duty cycle/delay adjusted clock signals 210 are coupled to an output of the calibrator 220, the test controller 202 is coupled to an output of the calibrator 220, and the calibrator 220 is coupled to an output of the sampler 214.

During clock calibration, the PLL 216 can receive a reference clock signal, generate a set of clock signals (e.g., four quarter-rate clock signals) based on the reference clock signal, and generate a data generator clock signal (e.g., FUI/32) for the digital data generator 204. In FIG. 2, duty cycle/delay adjusted clock signals 210 (DC/DLY clock signals 210) represent the plurality of clock signals generated by the PLL 216 and after being adjusted in accordance with calibration data generated by the calibrator 220. As shown, the DC/DLY clock signals 210 are eventually provided to the serializer 206, where the DC/DLY clock signals 210 can drive operation of the serializer 206. For some embodiments, a calibration controller controls operation of the digital data generator 204 and the calibrator 220 to facilitate adjustments (e.g., calibration) of one or more of the DC/DLY clock signals 210 as described herein. For some embodiments, the DC/DLY clock signals 210 can represent the clock signals provided by via one or more duty cycle adjusters and one or more delay adjusters. For some embodiments, the calibrator 220 includes a pattern checker 212, which facilitates calibration of the set of clocks signals provided by the PLL 216 to the serializer 206, and which also facilitates a data transmission test as described herein. According to some embodiments, the pattern checker 212 included by the calibrator 220 is similar to the pattern checker 112 illustrated and described with respect to FIG. 1.

FIG. 3 is a block diagram illustrating an example M/N phase-lock loop (PLL) 300 that can be used by various embodiments. For instance, the M/N PLL 300 can be used as the M/N PLL 118 in the circuit 100 of FIG. 1 or the M/N PLL 218 in the circuit 200 of FIG. 2. As shown, the M/N PLL 300 comprises a divider 310 for dividing by N (/N), a phase-frequency detector (PD) 312, a low-pass filter (LF) 314, a voltage-controlled crystal oscillator (VCO) 316, and a divider 320 for dividing by M (/M), and a divider 322 for dividing by P (/P). The divider 310 receives a reference clock signal (REF_CLK), the PD 312 is coupled to an output of the divider 310, the LF 314 is coupled to an output of the PD 312, the VCO 316 is coupled to an output of the LF 314, the divider 320 and divider 322 are each coupled to an output of the VCO 316, and the divider 322 outputs an output clock signal (OUT_CLK)(e.g., a sample clock signal as described herein). According to some embodiments, the M/N PLL 300 effectively divides the reference clock signal by N and multiplies the resulting clock signal by M to generate a modified clock signal, and the modified clock signal is further divided by P prior to being outputted as the output clock signal (e.g., the sample clock signal used by the pattern checker 112 and the sampler 114 for FIG. 1). Example values for an embodiment that is using a pre-determined data pattern comprising PRBS5 can include M=7, N=60, and P=4, where the reference clock signal can be 10 GHz and the output clock signal can be 291.6 MHz. For various embodiments, the M and N values of the M/N PLL are co-prime values.

Figure 4:
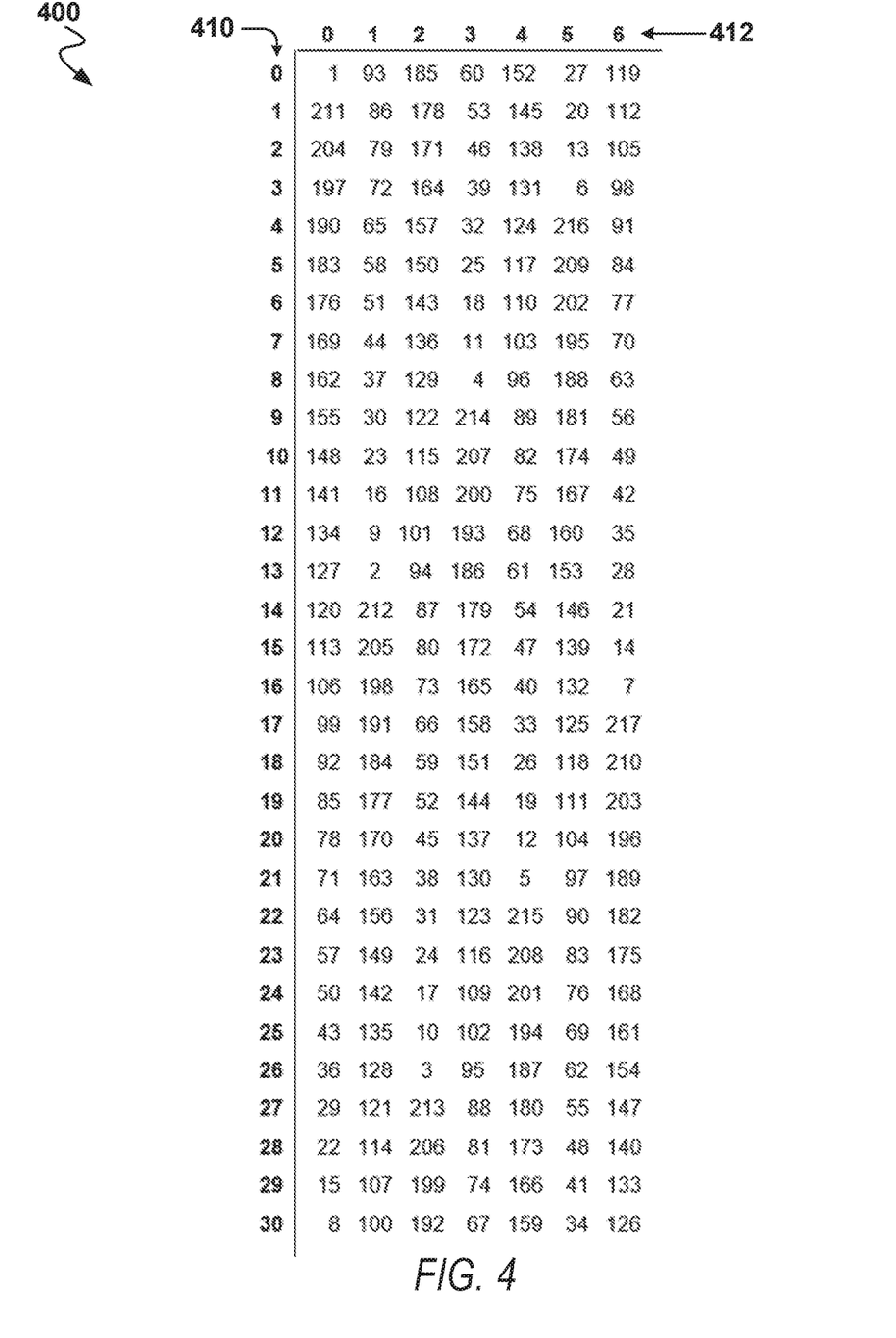
FIG. 4 is a chart illustrating an example matrix for storing samples of a predetermined data pattern collected from a data sampler, in accordance with some embodiments.

FIG. 4 is a chart illustrating an example matrix for storing samples of a predetermined data pattern collected from a data sampler, in accordance with some embodiments. In particular, the chart illustrates an example matrix 400 storing bits sampled (e.g., by sampler 114) from a PRBS5 outputted by a serializer (e.g., 106). The rows 410 represent the individual PRBS sample, and the columns 412 represent the unit interval (UI) phases. The matrix 400 illustrates how for some embodiments, the predetermined data pattern is sampled out of order (e.g., according to a known/expected sequence) as the predetermined data pattern outputted by the serializer.

Figure 5:
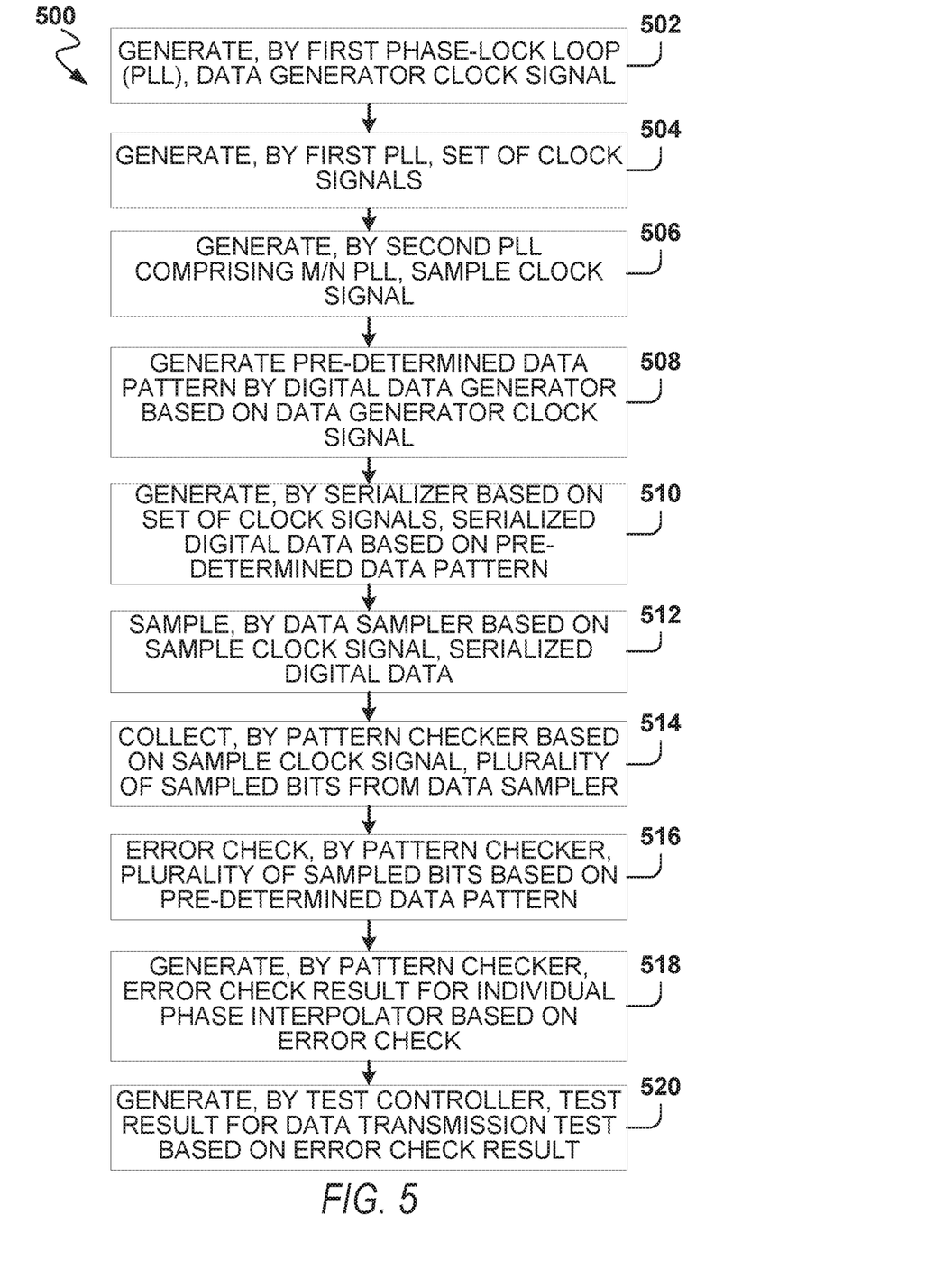
FIG. 5 is a flowchart illustrating an example method for testing a transmitter using a phase-lock loop, in accordance with some embodiments.

FIG. 5 is a flowchart illustrating an example method 500 for testing a transmitter using a phase-lock loop, in accordance with some embodiments. Some or all of the method 500 can be performed by a circuit such as the circuit 100 described herein with respect with FIG. 1. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

In FIG. 5, the method 500 begins with operation 502, where a first phase-lock loop (PLL) (e.g., 116) generates a data generator clock signal (e.g., FUI/32) based on a reference clock signal. At operation 504, the first PLL generates a set of generator clock signals (e.g., four quarter-rate clock signals) based on the reference clock signal. Additionally, at operation 506 a second PLL generates a sample clock signal based on the reference clock signal, where the second PLL comprises an M/N phase-lock loop (e.g., 300). For some embodiments, the M/N PLL (e.g., 300) comprises a divider (e.g., 322) to apply a post divide before the second PLL outputs the sample clock signal.

At operation 508, a digital data generator (e.g., 104), based on the data generator clock signal (generated by operation 502), generates a pre-determined data pattern (e.g., PRBS). The digital data generator can generate the pre-determined data pattern based on input (e.g., instructions) from a test controller (e.g., 102).

At operation 510, a serializer (e.g., 106) generates serialized digital data based on the pre-determined data pattern (generated by operation 508), where the serializer operates based on the set of clock signals (generated by operation 504).

At operation 512, a data sampler (e.g., 114), operating based on the sample clock signal (generated by operation 506), samples the serialized digital data (generated by operation 510).

At operation 514, a pattern checker (e.g., 112), operating based on the sample clock signal (generated by operation 506), collects a plurality of sampled bits as the digital data generator (e.g., 104) generates the pre-determined pattern, where the plurality of sampled bits is provided by the data sampler (e.g., 114). For various embodiments, operation 514 comprises the pattern checker storing the plurality of sampled bits in a first matrix. Additionally, for some embodiments, the predetermined data pattern is sampled out of order in a known/expected sequence by the data sampler based on the sample clock signal, and the pattern checker stores the plurality of sample bits in memory (e.g., in the first matrix) in the correct order based on the known/expected sequence.

At operation 516, the pattern checker (e.g., 112) error checks the plurality of sampled bits based on the predetermined data pattern. As described herein, the plurality of sampled bits can be stored in a first matrix and the predetermined data pattern can be stored in a second matrix, thereby permitting the pattern checker to compare the first matrix to (e.g., against) the second matrix to error check the plurality of sampled bits.

At operation 518, the pattern checker (e.g., 112) generates an error check result based on the error checking the plurality of sampled bits (provided by the data sampler 114). For various embodiments, operation 518 comprises the pattern checker determining a number of individual rows of the first matrix that have the comparison pass value, and the pattern checker generating the error check result based on the determining the number of individual rows of the first matrix that have the comparison pass value.

At operation 520, the test controller (e.g., 102) generates a test result for a data transmission test based on the error check result provided by operation 518. For some embodiments, the method 500 is performed for each different clock signal in the set of clock signals provided by the first phase-lock loop to the serializer. For some such embodiments, the overall result of the data transmission test can be determined based on the error result generated by the method 500 each of the different clock signals.

Figure 6:
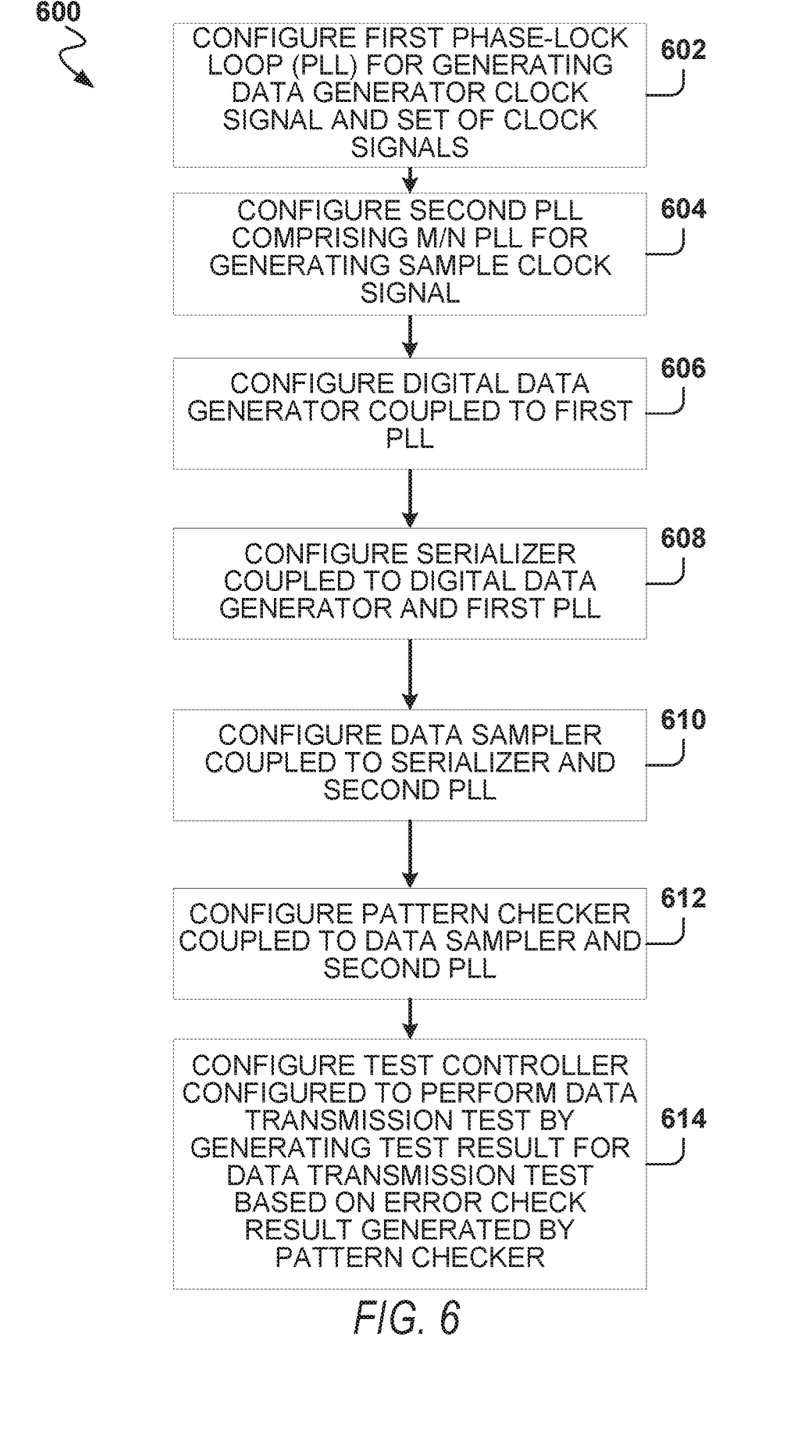
FIG. 6 is a flowchart illustrating an example method for generating a circuit design that includes transmitter testing using a phase-lock loop, in accordance with some embodiments.

FIG. 6 is a flowchart illustrating an example method 600 for generating a circuit design that includes transmitter testing using a phase-lock loop, in accordance with some embodiments. It will be understood that the method 600 can be performed by a device, such as a computing device executing instructions of an EDA software system, in accordance with some embodiments. Additionally, the method 600 herein can be implemented in the form of executable instructions stored on a computer-readable medium or in the form of electronic circuitry. For instance, the operations of the method 600 may be represented by executable instructions that, when executed by a processor of a computing device, cause the computing device to perform the method 600. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

In FIG. 6, the method 600 begins with operation 602, where a first phase-lock loop (PLL)(e.g., 116) is configured within the circuit design, where the first PLL is configured to generate, based on a reference clock signal, a data generator clock signal and a set of clock signals (e.g., first PLL comprises: a first PLL output to provide the data generator clock signal and a second PLL clock output to provide a set of clock signals). At operation 604, a second PLL (e.g., 118) is configured within the circuit design, where the second PLL comprises an M/N phase-lock loop and where the second PLL is configured to generate a sample clock signal based on the reference clock signal (e.g., second PLL comprises a phase-lock loop output to provide the sample clock signal). At operation 606, a digital data generator (e.g., 104) is configured within the circuit design, where the digital data generator is coupled to the first PLL, and where the digital data generator is configured to generate parallel digital data based on the data generator clock signal (parallel digital data generated by the digital data generator can be provided via a parallel data output). At operation 608, a serializer (e.g., 106) is configured within the circuit design, where the serializer is coupled to the digital data generator and the second PLL, where the serializer is configured to generate serialized digital data based on the parallel digital data and the set of clock signals (the serialized digital data can be provided via a serial data output). At operation 610, a data sampler (e.g., 114) is configured within the circuit design, where the data sampler is coupled to the serializer and the second PLL, where the data sampler is configured to sample the serialized digital data based on the sample clock signal (sampled data can be provided via a data sampler output). At operation 612, a pattern checker (e.g., 112) is configured within the circuit design, where the pattern checker is coupled to the data sampler and the second PLL. At operation 614, a test controller (e.g., 102) is configured within the circuit design, where the test controller is configured to perform a data transmission test by: receiving, from the pattern checker (e.g., 112), an error check result; and generating a test result for the data transmission test based on the error check result. For various embodiments, the error check result is generated (e.g., by the pattern checker 112) based on a plurality of sampled bits collected by the pattern checker (e.g., 112), from the data sampler (e.g., 114), as the digital data generator (e.g., 104) generates a pre-determined data pattern.

Figure 7:
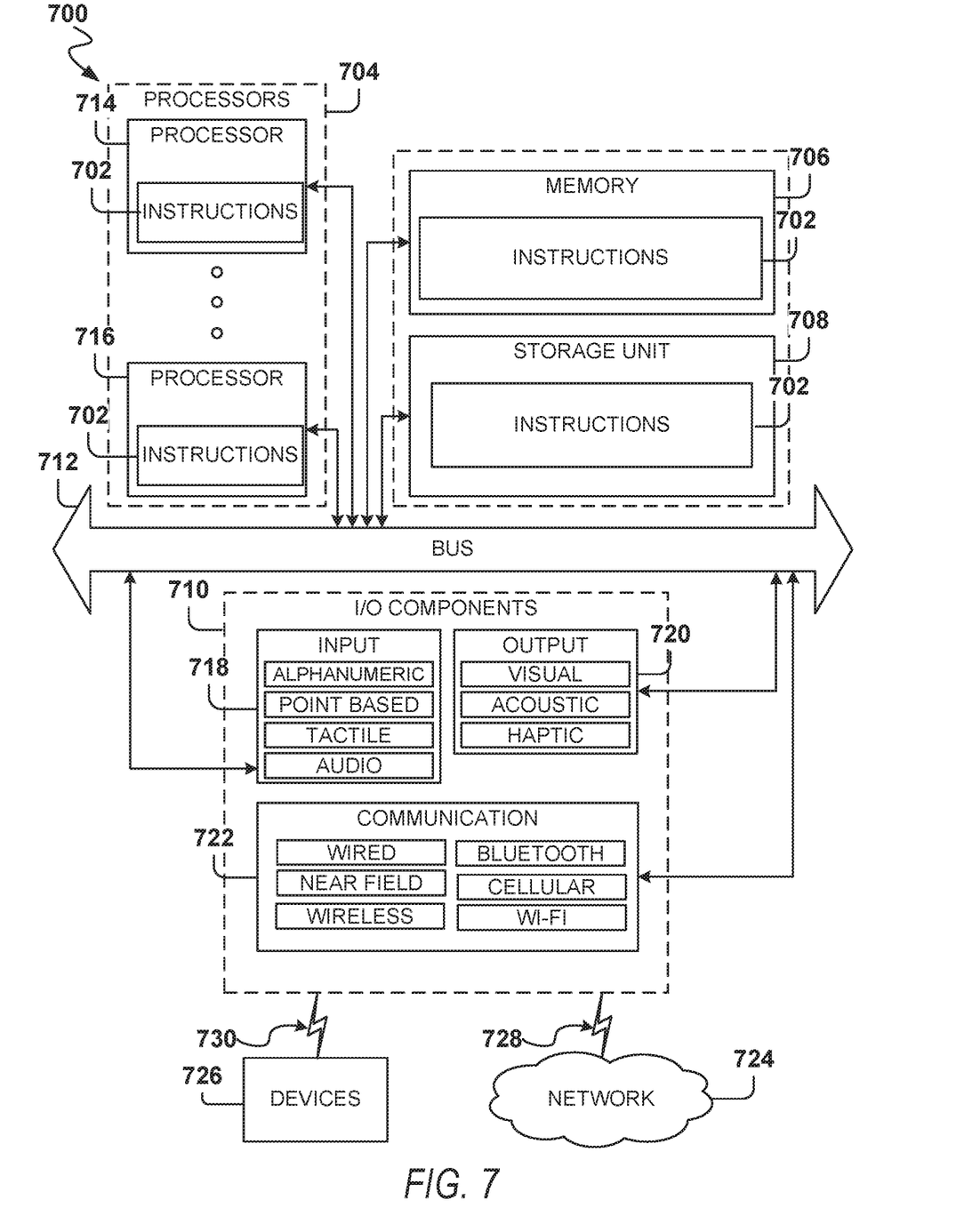
FIG. 7 is a block diagram illustrating components of a machine, according to some example embodiments, able to read instructions from a machine-readable medium and perform any one or more of the methodologies discussed herein.

FIG. 7 is a block diagram illustrating components of a machine 700, according to some example embodiments, able to read instructions from a machine-readable medium (e.g., a machine-readable storage medium) and perform any one or more of the methodologies discussed herein. Specifically, FIG. 7 shows a diagrammatic representation of the machine 700 in the example form of a system within which instructions 702 (e.g., software, a program, an application, an applet, an app, a driver, or other executable code) for causing the machine 700 to perform any one or more of the methodologies discussed herein may be executed. For example, the instructions 702 include executable code that causes the machine 700 to execute the method 600 described with respect to FIG. 6. In this way, these instructions 702 transform the general, non-programmed machine 700 into a particular machine programmed to carry out the described and illustrated method 600 in the manner described herein. The machine 700 may operate as a standalone device or may be coupled (e.g., networked) to other machines.

By way of non-limiting example, the machine 700 may comprise or correspond to a television, a computer (e.g., a server computer, a client computer, a personal computer (PC), a tablet computer, a laptop computer, or a netbook), a personal digital assistant (PDA), a smart phone, a mobile device, or any machine capable of executing the instructions 702, sequentially or otherwise, that specify actions to be taken by the machine 700. Further, while only a single machine 700 is illustrated, the term "machine" shall also be taken to include a collection of machines 700 that individually or jointly execute the instructions 702 to perform any one or more of the methodologies discussed herein.

The machine 700 may include processors 704, memory 706, a storage unit 708, and I/O components 710, which may be configured to communicate with each other such as via a bus 712. In an example embodiment, the processors 704 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 714 and a processor 716 that may execute the instructions 702. The term "processor" is intended to include multi-core processors 704 that may comprise two or more independent processors (sometimes referred to as "cores") that may execute instructions 702 contemporaneously. Although FIG. 7 shows multiple processors 704, the machine 700 may include a single processor with a single core, a single processor with multiple cores (e.g., a multi-core processor), multiple processors with a single core, multiple processors with multiple cores, or any combination thereof.

The memory 706 (e.g., a main memory or other memory storage) and the storage unit 708 are both accessible to the processors 704 such as via the bus 712. The memory 706 and the storage unit 708 store the instructions 702 embodying any one or more of the methodologies or functions described herein. The instructions 702 may also reside, completely or partially, within the memory 706, within the storage unit 708, within at least one of the processors 704 (e.g., within the processor's cache memory), or any suitable combination thereof, during execution thereof by the machine 700. Accordingly, the memory 706, the storage unit 708, and the memory of the processors 704 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 702. The term "machine-readable medium" shall also be taken to include any medium, or combination of multiple media, that is capable of storing instructions (e.g., instructions 702) for execution by a machine (e.g., machine 700), such that the instructions, when executed by one or more processors of the machine (e.g., processors 704), cause the machine to perform any one or more of the methodologies described herein (e.g., method 600). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 710 may include a wide variety of components to receive input, provide output, produce output, transmit information, exchange information, capture measurements, and so on. The specific I/O components 710 that are included in a particular machine 700 will depend on the type of the machine 700. For example, portable machines such as mobile phones will likely include a touch input device or other such input mechanisms, while a headless server machine will likely not include such a touch input device. It will be appreciated that the I/O components 710 may include many other components that are not specifically shown in FIG. 7. The I/O components 710 are grouped according to functionality merely for simplifying the following discussion and the grouping is in no way limiting. In various example embodiments, the I/O components 710 may include input components 718 and output components 720. The input components 718 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 720 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 710 may include communication components 722 operable to couple the machine 700 to a network 724 or devices 726 via a coupling 728 and a coupling 730 respectively. For example, the communication components 722 may include a network interface component or another suitable device to interface with the network 724. In further examples, the communication components 722 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 726 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA)

or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs).

Electronic Apparatus and System

Embodiments may be implemented in digital electronic circuitry, in computer hardware, firmware, or software, or in combinations of them. Embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 8:
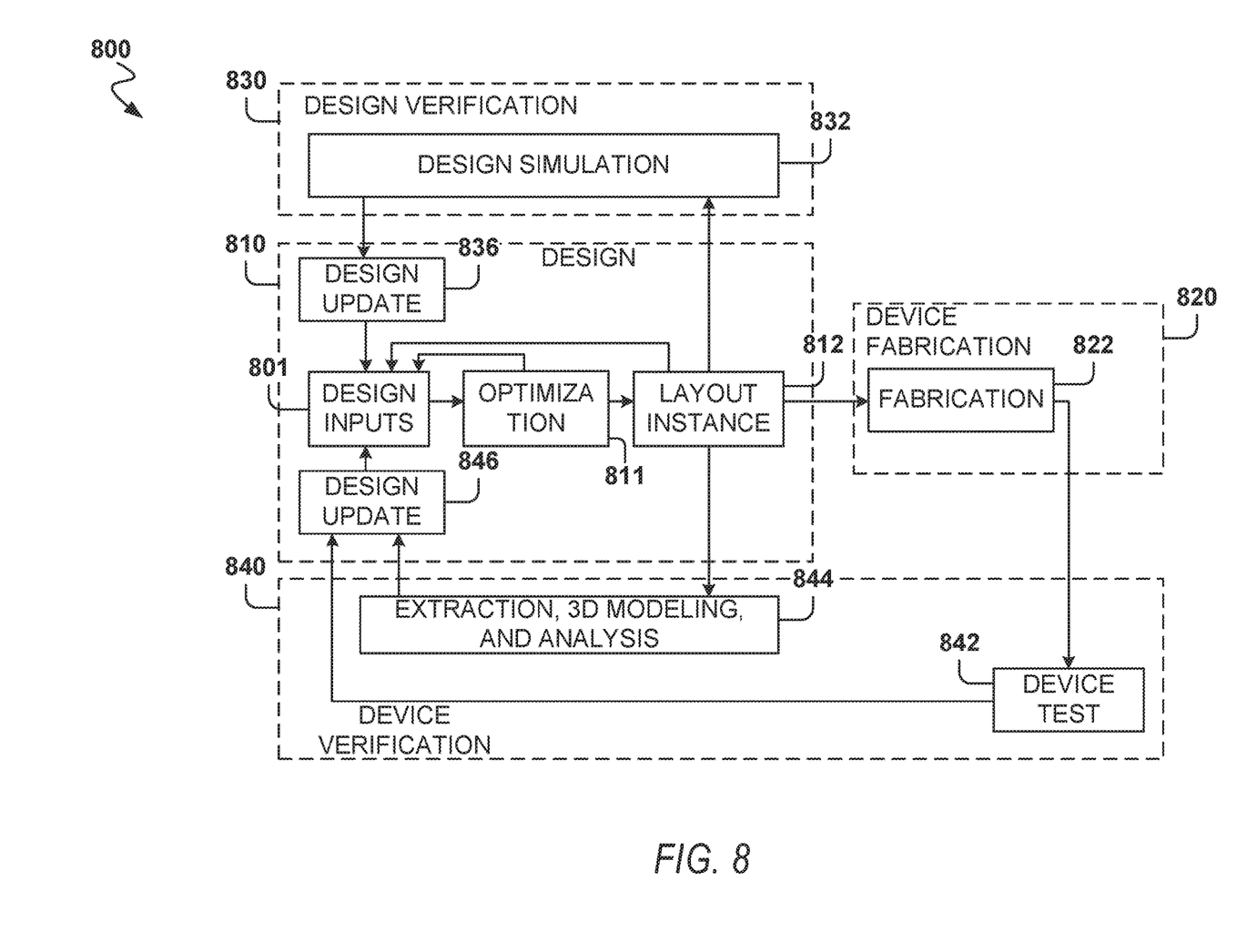
FIG. 8 is a diagram illustrating one possible design process flow for generating a circuit, including embodiments to implement transmitter testing using a phase-lock loop as described herein, and in various embodiments, to integrate the transmitter testing with a larger circuit.

FIG. 8 is a diagram illustrating one possible design process flow for generating a circuit, including embodiments to implement clock calibration for a serializer as described herein, and in various embodiments, to integrate the clock calibration with a larger circuit (e.g., SerDes circuit). As illustrated, the overall design flow 800 includes a design phase 810, a device fabrication phase 820, a design verification phase 830, and a device verification phase 840. The design phase 810 involves an initial design input operation 801 where the basic elements and functionality of a device are determined, as well as revisions based on various analyses and optimization of a circuit design. This design input operation 801 is where instances of an EDA circuit design file are used in the design and any additional circuitry is selected. The initial strategy, tactics, and context for the device to be created are also generated in the design input operation 801, depending on the particular design algorithm to be used.

In some embodiments, following an initial selection of design values in the design input operation 801, timing analysis and optimization according to various embodiments occurs in an optimization operation 811, along with any other automated design processes. One such process may be the automated design of a partitioned root search for error locator polynomial functions in RS FEC decoding. As described below, design constraints for blocks of a circuit design generated with design inputs in the design input operation 801 may be analyzed using hierarchical timing analysis, according to various embodiments. While the design flow 800 shows such optimization occurring prior to a layout instance 812, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 822.

After design inputs are used in the design input operation 801 to generate a circuit layout, and any optimization operations 811 are performed, a layout is generated in the layout instance 812. The layout describes the physical layout dimensions of the device that match the design inputs. This layout may then be used in the device fabrication operation 822 to generate a device, or additional testing and design updates may be performed using designer inputs or automated updates based on design simulation 832 operations or extraction, 3D modeling, and analysis 844 operations. Once the device is generated, the device can be tested as part of device test 842 operations, and layout modifications generated based on actual device performance.

As described in more detail below, design updates 836 from the design simulation 832, design updates 846 from the device test 842, the 3D modeling and analysis 844 operations, or the design input operation 801 may occur after an initial layout instance 812 is generated. In various embodiments, whenever design inputs are used to update or change an aspect of a circuit design, a timing analysis and optimization operation 811 may be performed.

For example, in various embodiments, a user may provide an input to a computing device indicating placement of elements of a circuit within a first portion of a circuit design, including description of circuitry for a multi-channel memory interface described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:
1. A circuit comprising:
   a first phase-lock loop configured to generate, based on a reference clock signal, a data generator clock signal and a set of clock signals;

a second phase-lock loop comprising an M/N phase-lock loop, the second phase-lock loop being configured to generate a sample clock signal based on the reference clock signal;

a digital data generator coupled to the first phase-lock loop, the digital data generator being configured to generate parallel digital data based on the data generator clock signal;

a serializer coupled to the digital data generator and the first phase-lock loop, the serializer being configured to generate serialized digital data based on the parallel digital data and the set of clock signals;

a data sampler coupled to the serializer and the second phase-lock loop, the data sampler being configured to sample the serialized digital data based on the sample clock signal;

a pattern checker coupled to the data sampler and the second phase-lock loop, the pattern checker operating based on the sample clock signal; and a test controller configured to perform a data transmission test by generating a test result for the data transmission test based on an error check result from the pattern checker, the error check result being generated by the pattern checker based on sampled bits collected from the data sampler as the digital data generator generates a pre-determined data pattern.

2. The circuit of claim 1, wherein performing the data transmission test comprises performing a separate iteration of the data transmission test for each different clock signal in the set of clock signals provided by the first phase-lock loop.

3. The circuit of claim 1, wherein the test controller is further configured to perform the data transmission test by:
    causing the digital data generator to generate the predetermined data pattern, the pattern checker being configured to collect from the data sampler a plurality of sampled bits as the digital data generator generates the pre-determined data pattern, to error check the plurality of sampled bits based on the pre-determined data pattern, and to generate the error check result based on the error checking the plurality of sampled bits.

4. The circuit of claim 3, wherein the pattern checker is further configured to collect from the data sampler the plurality of sampled bits as the digital data generator generates the pre-determined data pattern by:
    storing the plurality of sampled bits in a first matrix.

5. The circuit of claim 4, wherein the pattern checker is further configured to error check the plurality of sampled bits based on the pre-determined data pattern by:
    for each individual row of the first matrix, comparing the individual row to a corresponding row of a second matrix, the second matrix comprising the pre-determined data pattern, and the second matrix having same dimensions as the first matrix.

6. The circuit of claim 1, wherein the pre-determined data pattern comprises a pseudorandom binary sequence (PRBS).

7. The circuit of claim 1, wherein the pattern checker comprises a series of flip-flops, the pattern checker operating by pre-loading the pre-determined data pattern into the series of flip-flops.

8. The circuit of claim 1, wherein the M/N phase-lock loop comprises a divider.

9. A method comprising:
    generating, by a first phase-lock loop clock, a data generator clock signal based on a reference clock signal;
    generating, by the first phase-lock loop clock, a set of clock signals based on the reference clock signal;
    generating, by a second phase-lock loop, a sample clock signal based on the reference clock signal, the second phase-lock loop comprising an M/N phase-lock loop;
    generating, by a digital data generator, a pre-determined data pattern;
    generating, by a serializer, serialized digital data based on the pre-determined data pattern, where the serializer operates based on the set of clock signals;
    sampling, by a data sampler operating based on the sample clock signal, the serialized digital data;
    collecting, by a pattern checker operating based on the sample clock signal, a plurality of sampled bits as the digital data generator generates the pre-determined data pattern, the plurality of sampled bits being provided by the data sampler;
    error checking, by the pattern checker, the plurality of sampled bits based on the pre-determined data pattern;
    generating, by the pattern checker, an error check result based on the error checking the plurality of sampled bits; and
    generating, by a test controller, a test result for a data transmission test based on the error check result, generated by the pattern checker based on the plurality of sample bits provided by the data sampler.

10. The method of claim 9, wherein the method is performed for each different clock signal in the set of clock signals provided by the first phase-lock loop to the serializer.

11. The method of claim 9, where the collecting the plurality of sampled bits as the digital data generator generates the pre-determined data pattern comprises:
    storing the plurality of sampled bits in a first matrix, the error checking the plurality of sampled bits based on the pre-determined data pattern comprising:
        for each individual row of the first matrix, comparing the individual row to a corresponding row of a second matrix, the second matrix comprising the pre-determined data pattern, and the second matrix having same dimensions as the first matrix.

12. The method of claim 9, wherein the pre-determined data pattern comprises a pseudorandom binary sequence (PRBS).

13. A non-transitory computer-readable medium comprising instructions that, when executed by one or more processors of a computing device, cause the computing device to generate a circuit design by performing operations comprising:
    configuring, in the circuit design, a first phase-lock loop that is configured to generate, based on a reference clock signal, a data generator clock signal and a set of clock signals;
    configuring, in the circuit design, a second phase-lock loop that comprises an M/N phase-lock loop, the second phase-lock loop being configured to generate a sample clock signal based on the reference clock signal;
    configuring, in the circuit design, a digital data generator coupled to the first phase-lock loop, the digital data generator being configured to generate parallel digital data based on the data generator clock signal;
    configuring, in the circuit design, a serializer coupled to the digital data generator and the first phase-lock loop, the serializer being configured to generate serialized digital data based on the parallel digital data and the set of clock signals;

configuring, in the circuit design, a data sampler coupled to the serializer and the second phase-lock loop, the data sampler being configured to sample the serialized digital data based on the sample clock signal;

configuring, in the circuit design, a pattern checker coupled to the data sampler and the second phase-lock loop; and configuring, in the circuit design, a test controller configured to perform a data transmission test by generating a test result for the data transmission test based on an error check result, the error check result being generated by the pattern checker based on sampled bits collected by the pattern checker, from the data sampler, as the digital data generator generates a pre-determined data pattern.

14. The non-transitory computer-readable medium of claim 13, wherein performing the data transmission test comprises performing a separate iteration of the data transmission test for each different clock signal in the set of clock signals provided by the first phase-lock loop.

15. The non-transitory computer-readable medium of claim 13, wherein the test controller is further configured to perform the data transmission test by:

causing the digital data generator to generate the pre-determined data pattern, the pattern checker being configured to collect from the data sampler a plurality of sampled bits as the digital data generator generates the pre-determined data pattern, to error check the plurality of sampled bits based on the pre-determined data pattern, and to generate the error check result based on the error checking the plurality of sampled bits.

16. The non-transitory computer-readable medium of claim 15, wherein the pattern checker is further configured to collect from the data sampler the plurality of sampled bits as the digital data generator generates the pre-determined data pattern by:

storing the plurality of sampled bits in a first matrix.

17. The non-transitory computer-readable medium of claim 16, wherein the pattern checker is further configured to error check the plurality of sampled bits based on the pre-determined data pattern by:

for each individual row of the first matrix, comparing the individual row to a corresponding row of a second matrix, the second matrix comprising the pre-determined data pattern, and the second matrix having same dimensions as the first matrix.

18. The non-transitory computer-readable medium of claim 13, wherein the pre-determined data pattern comprises a pseudorandom binary sequence (PRBS).

19. The non-transitory computer-readable medium of claim 13, wherein the pattern checker comprises a series of flip-flops, the pattern checker operating by pre-loading the pre-determined data pattern into the series of flip-flops.

20. The non-transitory computer-readable medium of claim 13, wherein the M/N phase-lock loop comprises a divider.

* * * * *